United States Patent
Ke et al.

(10) Patent No.: US 10,264,718 B2
(45) Date of Patent: Apr. 16, 2019

(54) EXTERNAL-LEADWIRE CRIMPING APPARATUS

(71) Applicants: BOE Technology Group Co., Ltd., Beijing (CN); Hefei Xinsheng Optoelectronics Technology Co., Ltd., Anhui (CN)

(72) Inventors: Yusheng Ke, Beijing (CN); Yanping Li, Beijing (CN); Jiali Wang, Beijing (CN); Junjun Liu, Beijing (CN); Yun Wang, Beijing (CN); Xinwei Huang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 168 days.

(21) Appl. No.: 15/233,995

(22) Filed: Aug. 11, 2016

(65) Prior Publication Data
US 2017/0265341 A1    Sep. 14, 2017

(30) Foreign Application Priority Data
Mar. 8, 2016 (CN) .......................... 2016 1 0131602

(51) Int. Cl.
*H05K 13/00* (2006.01)
*H01R 12/79* (2011.01)
(Continued)

(52) U.S. Cl.
CPC ......... *H05K 13/0092* (2013.01); *H01R 12/79* (2013.01); *H01R 43/0242* (2013.01); *H05K 3/365* (2013.01)

(58) Field of Classification Search
CPC ...... H05K 13/0092; H05K 1/00; H05K 3/365; H01L 23/34; H01L 23/433;
(Continued)

(56) References Cited

U.S. PATENT DOCUMENTS

| 5,493,074 A | 2/1996 | Murata et al. |
| 9,279,626 B2* | 3/2016 | Berukhim ............... F28F 9/028 |
| 2015/0129135 A1* | 5/2015 | Lee .......................... H01L 24/75 |
| | | 156/378 |

FOREIGN PATENT DOCUMENTS

| CN | 101247710 A | 8/2008 |
| CN | 101311879 A | 11/2008 |
| (Continued) | | |

OTHER PUBLICATIONS

JP2013012542A_TakahashiBase_TRANSLATED.*
(Continued)

*Primary Examiner* — Peter Dungba Vo
*Assistant Examiner* — Lydie Louis
(74) *Attorney, Agent, or Firm* — Westman, Champlin & Koehler, P.A.

(57) ABSTRACT

An external-leadwire crimping apparatus is provided by embodiments of the present invention, including: a heating base provided with a heating rod and a temperature sensor; a crimping tool tip which is connected with the heating base and supplied with heat from the heating base, the crimping tool tip being configured to to crimp a leadwire of a flexible printed circuit board onto a printed circuit board assembly, by curing a conductive adhesive after receipt of heat, and the crimping tool tip comprising a crimping tool tip body. The crimping tool tip body is provided with at least one heat dissipation slot on an upper surface thereof, the heat dissipation slot being configured to extend in a thickness direction of the crimping tool tip body and to penetrate therethrough at both ends; and the crimping tool tip body is (Continued)

provided with at least one heat dissipation hole penetrating the thickness direction thereof.

18 Claims, 4 Drawing Sheets

(51) Int. Cl.
*H01R 43/02* (2006.01)
*H05K 3/36* (2006.01)
*H01L 23/00* (2006.01)

(58) Field of Classification Search
CPC ..... H01L 2224/85203; H01L 21/67092; H01L 2224/16227; H01L 21/67144; H01L 2224/04042; H01L 2224/83851; B23K 20/023; B23K 20/025; H01R 12/79; H01R 43/0242
USPC ........... 257/334, 378; 361/679.47; 156/583.1
See application file for complete search history.

(56) References Cited

FOREIGN PATENT DOCUMENTS

| CN | 101794941 A | 8/2010 | |
|---|---|---|---|
| CN | 201878420 U | 6/2011 | |
| CN | 202013747 U | 10/2011 | |
| CN | 102378556 A | 3/2012 | |
| CN | 103200788 A | 7/2013 | |
| CN | 203574995 U | 4/2014 | |
| CN | 104241900 A | 12/2014 | |
| CN | 204155201 U | 2/2015 | |
| JP | 2002164151 A * | 6/2002 | ............. H01L 24/75 |
| JP | 2013012542 A * | 1/2013 | |

OTHER PUBLICATIONS

JP2002164151A_Tsurumaru_TRANSLATED.*
First Office Action, including Search Report, for Chinese Patent Application No. 201610131602.X, dated Oct. 11, 2017, 12 pages.

* cited by examiner

EXTERNAL-LEADWIRE CRIMPING APPARATUS

CROSS-REFERENCE TO RELATED APPLICATION

This application claims the benefit of Chinese Patent Application No. 201610131602.X filed on Mar. 8, 2016 in the State Intellectual Property Office of China, the whole disclosure of which is incorporated herein by reference.

BACKGROUND OF THE INVENTION

Field of the Invention

Embodiments of the present invention relate to the technical field of display technology, and in particular to an external-leadwire crimping apparatus.

Description of the Related Art

In the prior art, nowadays, with a diversified and sophisticated trend of electrical circuit products, shapes of bonding on printed circuit boards (abbreviated as PCB hereinafter) become increasingly sophisticated. When a long type crimping apparatus for an external leadwire is applied in bonding, i.e., a Long Tool Bonding is implemented, each type of crimping tool tip may correspond to only one type of printed circuit boards, leading to a dedicatedly prepared and thus expensive tool tip, long replacement time, and difficult in management thereof. When a short type crimping apparatus for an external leadwire is applied in bonding, i.e., a Short Tool Bonding is implemented, a tool tip or a set of tool tips may correspond to a plurality of printed circuit boards, realizing a tool tip or tool tips which may be versatile, leading to a shortened replacement time thereof and thus easier management. In order to cope with bonding of a PCB having a complicated structure and to facilitate management, in a FPC-On-Board (abbreviated as FOB hereinafter) bonding process which bonds lead-wires of a flexible circuit board onto a printed circuit board, the Short Tool Bonding is widely adopted at present.

As illustrated in FIG. 1, an existing Short Tool Bonding apparatus comprises a heating base 01 which is provided with heating holes 011 inside each of which a heating rod is mounted and temperature sensor installation holes 012 inside each of which a temperature sensor is mounted, and a Tool Tip 02 which is secured onto the heating base 01. A main problem for existing Short tool lies in that temperature across a lower surface of the Tool Tip are unevenly distributed when the heating rod is heating the heating base 01 and the heat is transferred onto the Tool Tip 02; to be specific, for example, as viewed from front (i.e., observed from a front face of the Tool Tip 02), a temperature difference between left and/or right edge(s) and a center portion thereof may reach up to 25° C. which in fact may impact a reaction rate of anisotropic conductive films (abbreviated as ACF hereinafter) seriously, resulting in inferior compression quality of FOB bonding, poor reliability; therefore, the product quality may not be guaranteed.

Therefore, An urgent technical problem for those skilled in the prior art is how to solve the problem of unevenly distributed temperature across the lower surface of the Tool Tip during a Short Tool Bonding process for bonding onto a printed circuit board.

SUMMARY OF THE INVENTION

Embodiments of the present invention has been made to overcome or alleviate at least one aspect of the above mentioned disadvantages and/or shortcomings, by providing an external-leadwire crimping apparatus which may ensure uniformity of surface temperatures of a crimping tool tip such that a temperature difference between both left and right ends and a center portion of the lower surface of the crimping tool tip would not be too excessive.

The following technical solutions are adopted in exemplary embodiments of the invention for achieving the above desired technical purposes.

Therefore, an external-leadwire crimping apparatus is provided by an exemplary embodiment of the invention, comprising a heating base provided with a heating rod and a temperature sensor, and a crimping tool tip which is connected with the heating base and supplied with heat from the heating base, the crimping tool tip being configured to crimp a leadwire of a flexible printed circuit board onto a printed circuit board assembly, by curing a conductive adhesive after receipt of heat, and the crimping tool tip comprising a crimping tool tip body; the crimping tool tip body is provided on an upper surface thereof with at least one heat dissipation slot, the heat dissipation slot being configured to extend in a thickness direction of the crimping tool tip body and to penetrate the crimping tool tip body at both ends; and/or the crimping tool tip body is provided with at least one heat dissipation hole penetrating the thickness direction thereof.

BRIEF DESCRIPTION OF THE DRAWINGS

The above and other features and advantages of the present invention will become more apparent and a more comprehensive understanding of the present invention can be obtained, by describing in detail exemplary embodiments thereof with reference to the accompanying drawings, in which.

DETAILED DESCRIPTION OF PREFERRED EMBODIMENTS OF THE INVENTION

Figure 1:
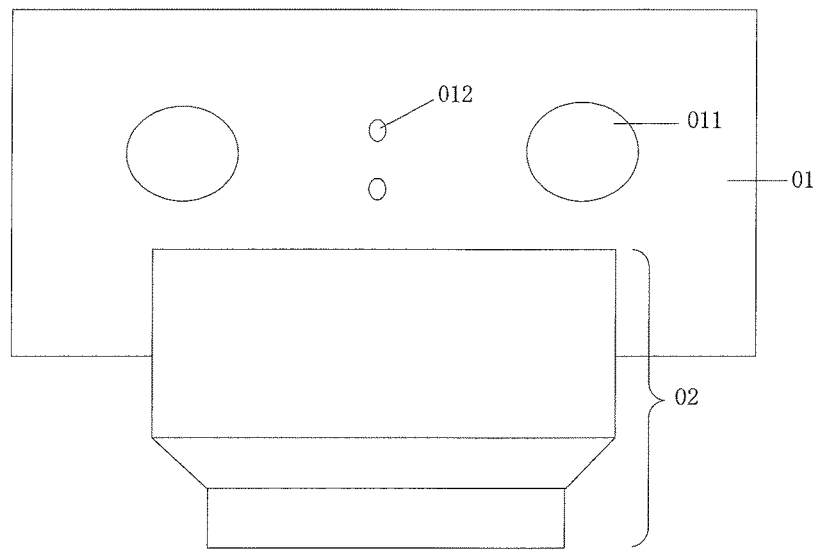
FIG. 1 illustrates a front schematic structural view of an external-leadwire crimping apparatus in the prior art.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the invention in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective thickness and shape of each structure in the drawings are only intended to exemplarily illustrate the contents of the disclosure, rather than to demonstrate the practical dimension or proportion of the external-leadwire crimping apparatus.

Figure 2A:
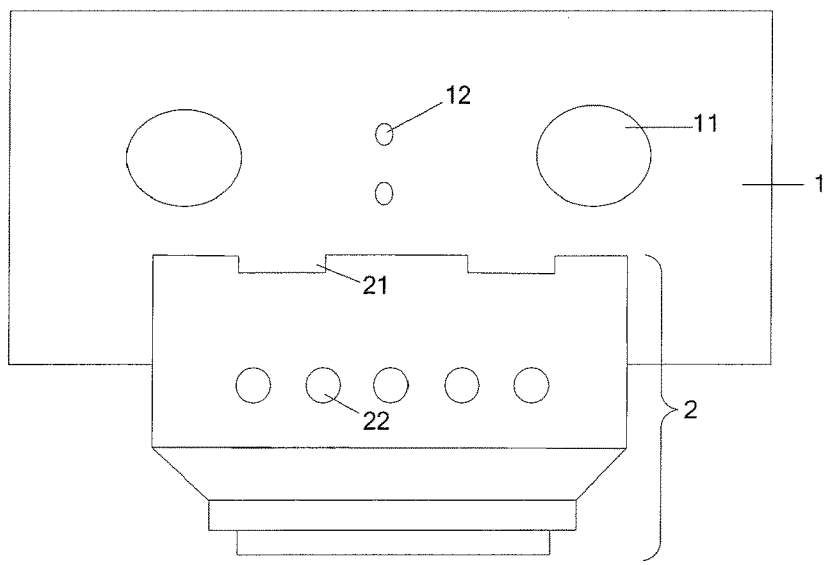
FIG. 2a illustrates a first schematic structural front view of an external-leadwire crimping apparatus according to one embodiment of the present invention.
Figure 2B:
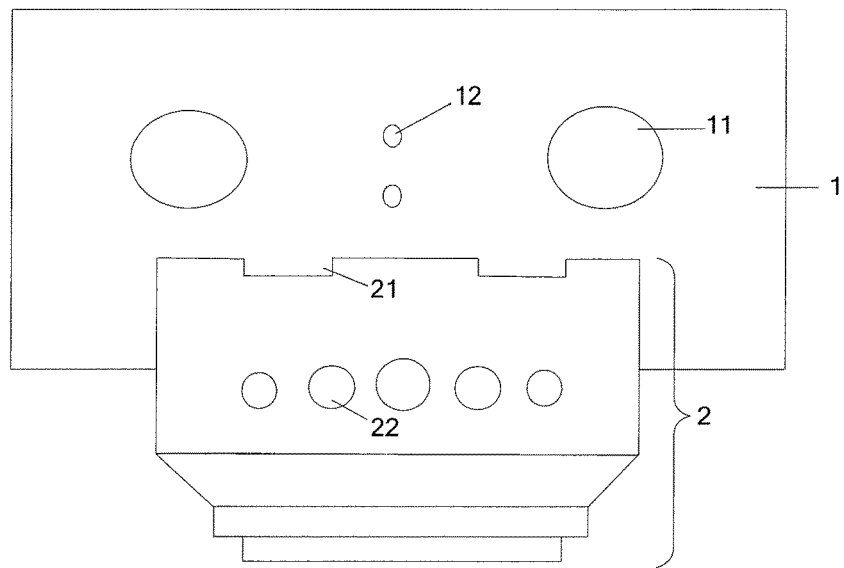
FIG. 2b illustrates a second schematic structural front view of an external-leadwire crimping apparatus according to one embodiment of the present invention.

According to a general technical concept of the present invention, there is provided a crimping apparatus for external leadwire, as illustrated in FIGS. 2a and 2b, comprising a heating base 1 provided with a heating rod and a temperature sensor, and a crimping tool tip 2 which is connected with the heating base 1 and supplied with heat from the heating base 1, the crimping tool tip being configured to crimp a leadwire of a flexible printed circuit board onto a printed circuit board assembly, by curing a conductive adhesive after receipt of heat, and the crimping tool tip comprising a crimping tool tip body; the crimping tool tip body is provided with at least one heat dissipation slot 21 on an upper surface thereof, the heat dissipation slot 21 being configured to extend in a thickness direction of the crimping tool tip body and to penetrate therethrough at both ends; and/or the crimping tool tip body is provided with at least one heat dissipation hole 22 penetrating the thickness direction thereof.

In an external-leadwire crimping apparatus provided by an exemplary embodiment of the invention, the crimping tool tip body is provided with at least one heat dissipation slot on an upper surface thereof, the heat dissipation slot being configured to extend in a thickness direction of the crimping tool tip body and to penetrate therethrough at both ends; and/or the crimping tool tip body is provided with at least one heat dissipation hole penetrating the thickness direction thereof. Within the external-leadwire crimping apparatus, a design with heat dissipation slots and/or heat dissipation holes extending in a thickness direction of the crimping tool tip body and penetrating therein solves a problem of uneven surface temperature of the crimping tool tip caused by a transmission of most of the heat generated by the heating rod towards a central position of the crimping tool tip, facilitating the uniformity of surface temperature of the crimping tool tip so as to control a temperature difference between both left and right ends and a central portion of a lower surface of the crimping tool tip to be constrained within a certain temperature difference range, e.g., within 10° C., so as to offer guarantee for a uniformity of reaction of the anisotropic conductive films (ACF), resulting in an enhanced crimping quality.

Specifically, taking Fe which functions as a material for the crimping tool tip for example, Fe is provided with a coefficient of heat conduction (with a value of 80 w/m·k) which is far higher than that of air (with a value of 0.023 w/m·k), facilitating faster heat conduction. In the prior art, since the central position of the crimping tool tip is configured to be close to the heating rod mounted on the heating base, heat tends to be delivered towards the central position of the crimping tool tip, resulting in higher temperature across the central portion of its lower surface. In one exemplary embodiment of the present invention, air in the heat dissipation slot(s) facilitates deduction of conduction of heat generated by the heating rod towards the central position of the crimping tool tip, and he heat dissipation holes may radiate a portion of heat at the central position of the crimping tool tip by means of air convection, dissipating heat delivered towards the central position of the crimping tool tip.

It should be noticed that, as illustrated in FIGS. 2a and 2b, the heating base 1 is provided with heating holes 11 inside each of which a heating rod is mounted and temperature sensor installation holes 12 inside each of which a temperature sensor is mounted; a width range of the heating base 1 ranges, e.g., from 1 cm to 200 cm; the heating holes 11 are provided in an amount, e.g., of 1 to 10 and the temperature sensor installation holes 12 are provided in an amount, e.g., of 1 to 10; and a diameter range of the heating holes 11 is configured to range from 3 mm to 20 mm, for example. The crimping tool tip 2 is securely connected with the heating base 1, e.g., by a screw (not illustrated in FIGS. 2a and 2b); certainly, e.g., alternatively by other connection means. Here the specific connection types are not specified.

Figure 5A:
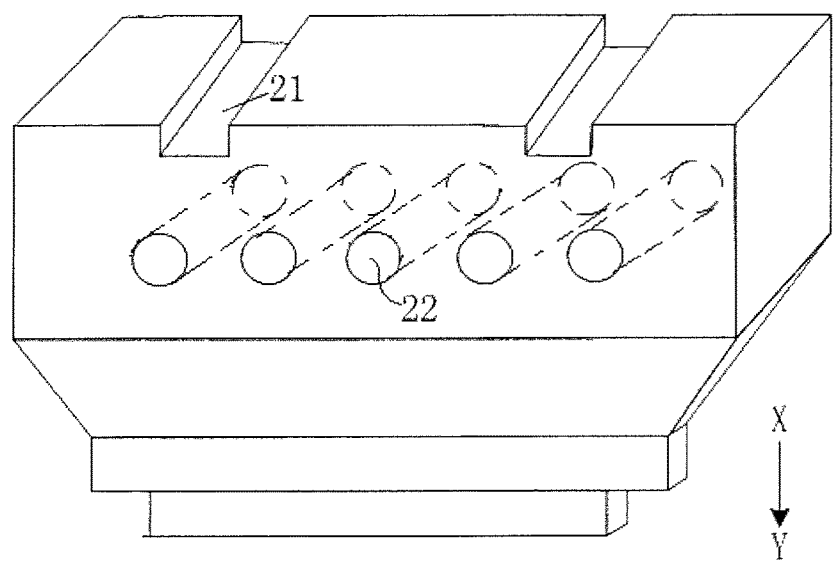
FIG. 5a illustrates an exemplary schematic structural perspective view of a crimping tool tip according to one embodiment of the present invention.
Figure 5B:
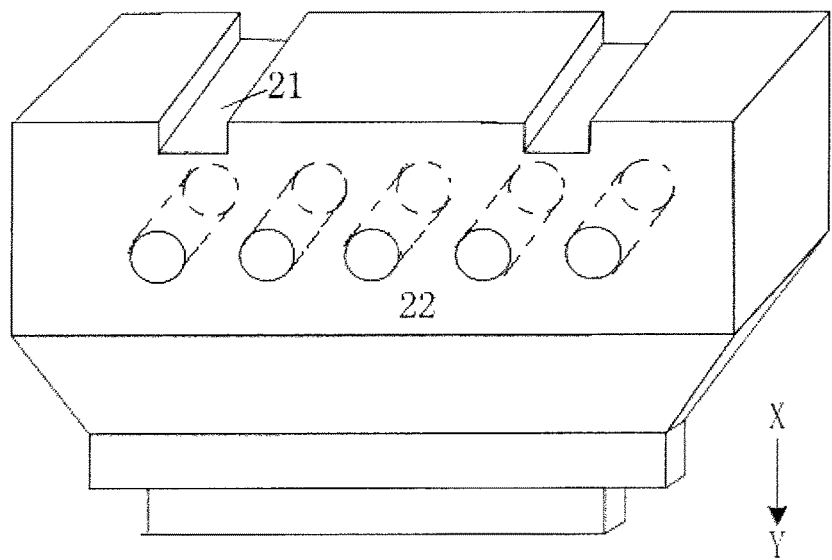
FIG. 5b illustrates another exemplary schematic structural perspective view of a crimping tool tip according to another embodiment of the present invention.

Upon practical implementation, in aforementioned external-leadwire crimping apparatus provided by exemplary embodiments of the invention, in case that the crimping tool tip is provided with at least two heat dissipation holes, the heat dissipation holes are arranged to be in parallel in a direction leading from one side towards another side of the crimping tool tip body, e.g., being arranged in parallel in a direction transvers to the thickness direction of the crimping tool tip body. By way of specific exemplary embodiment, within the crimping tool tip body, the at least two heat dissipation holes are arranged in parallel in a direction orthogonal to the thickness direction of the crimping tool tip body, in a plane parallel to the upper surface and/or the lower surface of the crimping tool tip body, e.g., in a direction transverse to the thickness direction of the crimping tool tip body, as illustrated in FIG. 5a; or alternatively, in a direction orthogonal to the thickness direction of the crimping tool tip body, as illustrated in FIG. 5b. According to an exemplary embodiment of the invention, as illustrated in FIGS. 3a and 3b, in case that the crimping tool tip 2 is provided with five heat dissipation holes 22, the heat dissipation holes 22 are each arranged to be in parallel in a direction leading from a left side to a right side of the crimping tool tip body (i.e., a direction as illustrated by an arrow pointing from M towards N); as such, the air convection is taken advantage of, facilitating bring away a part of heat at the central portion of the crimping tool tip, and ensuring more uniform surface temperature distribution across the crimping tool tip.

Figure 3A:
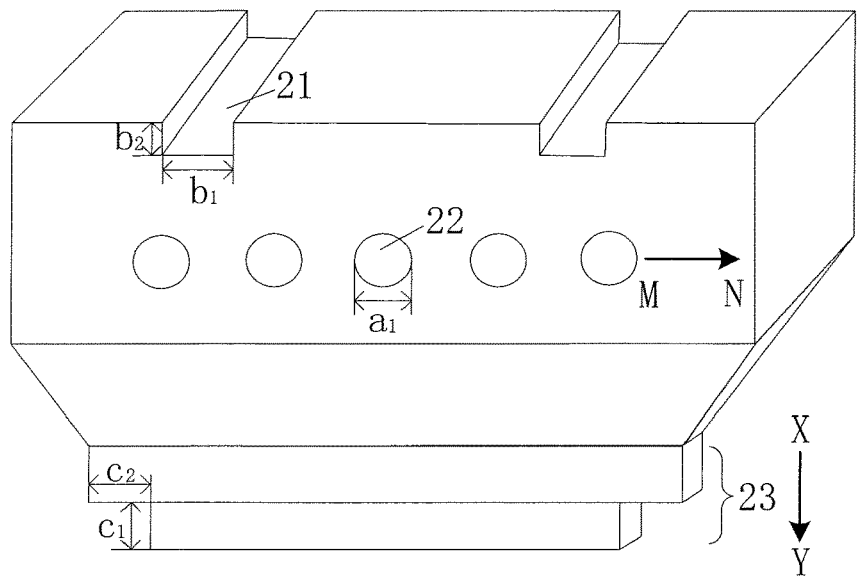
FIG. 3a illustrates a first schematic structural perspective view of a crimping tool tip according to one embodiment of the present invention.
Figure 3B:
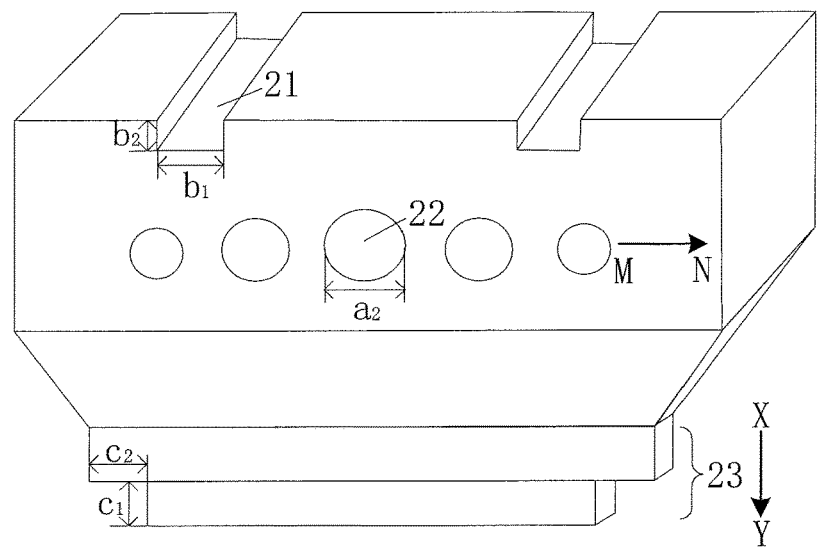
FIG. 3b illustrates a second schematic structural perspective view of a crimping tool tip according to one embodiment of the present invention.

In case that the crimping tool tip 2 is provided with at least two heat dissipation holes 22, the configuration of diameters of the heat dissipation holes comprises following two implementations, specifically, by way of example:

In a first implementation, specifically, in aforementioned external-leadwire crimping apparatus provided by exemplary embodiments of the invention, as illustrated in FIGS. 2a and 3a, for example, diameters $a_1$ of the heat dissipation holes 22 are arranged to be identical, resulting in a simple structure and facilitating radiation of a portion of heat.

In a second implementation, specifically, in aforementioned external-leadwire crimping apparatus provided by exemplary embodiments of the invention, as illustrated in FIGS. 2a and 3a, for example, diameters of the heat dissipation holes 22 descend sequentially in both directions leading from a center towards both ends of the crimping tool tip body; in other words, the most centered heat dissipation holes 22 has the largest diameter $a_2$, such that heat is radiated most at the central position of the crimping tool tip.

In above two embodiments, the second implementation is more favorable for facilitating uniformity of the temperatures across the lower surface of the crimping tool tip, as compared with the first implementation. Upon practical implementation, a specific choice between the two implementations is for example made as per actual requirements, and is thus not specified herein.

Upon practical implementation, in aforementioned external-leadwire crimping apparatus provided by exemplary embodiments of the invention, a diameter range of the heat dissipation holes may be configured to range from 0.1 mm to 10 mm, for example. Specific configuration of diameters of the heat dissipation holes is for example determined as per actual requirement, and is thus not specified herein.

Upon practical implementation, in aforementioned external-leadwire crimping apparatus provided by exemplary embodiments of the invention, as illustrated in FIGS. 3a and 3b, a width $b_1$ of the heat dissipation slot may be configured to range from 0.1 mm to 10 mm while a depth $b_2$ of the heat dissipation slot may be configured to range from 0.1 mm to 10 mm Specific configuration of the width and the depth of the heat dissipation slot is for example determined as per actual requirement, and is thus not specified herein.

Furthermore, upon practical implementation, in aforementioned external-leadwire crimping apparatus provided by exemplary embodiments of the invention, as illustrated in FIGS. 3a and 3b, the crimping tool tip body comprises a contact portion 23 in contact with a leadwire to be crimped, the contact portion 23 further comprising a stepped integral structure formed by at least two overlapped cuboids (FIGS. 3a and 3b illustrate a stepped integral structure formed by two overlapped cuboids); and cross section of the cuboids within the stepped integral structure descends sequentially in a direction from the upper surface towards the lower surface of the crimping tool tip body (i.e., in a direction as illustrated by an arrow pointing from X towards Y). In other words, the contact portion 23 of the crimping tool tip is of a stepped segment difference design, which may decrease the distance of the heat delivered towards the lower surface of the crimping tool tip, decreasing the heat loss and enhancing temperature at both ends of the lower surface, such that uniformity of the temperatures across the lower surface of the crimping tool tip is further ensured.

Upon practical implementation, in aforementioned external-leadwire crimping apparatus provided by exemplary embodiments of the invention, height $c_1$ of the cuboids within the stepped integral structure may be configured to range e.g., from 0.1 mm to 10 mm, and a length difference between two adjacent cuboids of the cuboids within the stepped integral structure may be configured to range e.g., from 0.2 mm to 200 mm. In other words, a range of length difference $c_2$ (a range of segment difference length at one of both ends) between the two adjacent cuboids within the stepped integral structure at either single side (e.g., left side or right side) which is configured to range from 0.1 mm to 100 mm, for example. Specific configuration of the contact portion is for example determined as per actual requirement, and is thus not specified herein.

Upon practical implementation, in aforementioned external-leadwire crimping apparatus provided by exemplary embodiments of the invention, a distance between a lower surface of the heating base and the lower surface of the crimping tool tip body may be configured to range e.g., from 2 mm to 100 mm. As compared with the prior art, the distance between the lower surface of the heating base and the lower surface of the crimping tool tip body is decreased, facilitating deduction of heat loss at edges of the crimping tool tip during heat conduction process. Specific configuration of this distance is for example determined as per actual requirement, and is thus not specified herein.

Upon practical implementation, a distance between a heating hole and a most adjacent side of the heating base may be configured to range from 1 mm to 20 mm, by way of example. As compared with the prior art, the distance between a heating hole and a most adjacent side of the heating base is shortened, for example, such that more heat may be conducted to edges of the crimping tool tip, enhancing temperature at both ends of the crimping tool tip. Specific configuration of such distance is for example determined as per actual requirement, and is thus not specified herein.

Upon practical implementation, in aforementioned external-leadwire crimping apparatus provided by exemplary embodiments of the invention, the heat dissipation slots are provided in a number of not more than 10, for example. And by way of example, the heat dissipation holes are provided in a number of not more than 50. As an exemplary embodiment, in FIGS. 3a and 3b, the number of the heat dissipation slots is shown as 2 while the number of the heat dissipation holes is shown as 5. Specific configuration of numbers of the heat dissipation slots and the heat dissipation holes is for example determined as per actual requirement, and is thus not specified herein.

Figure 4:
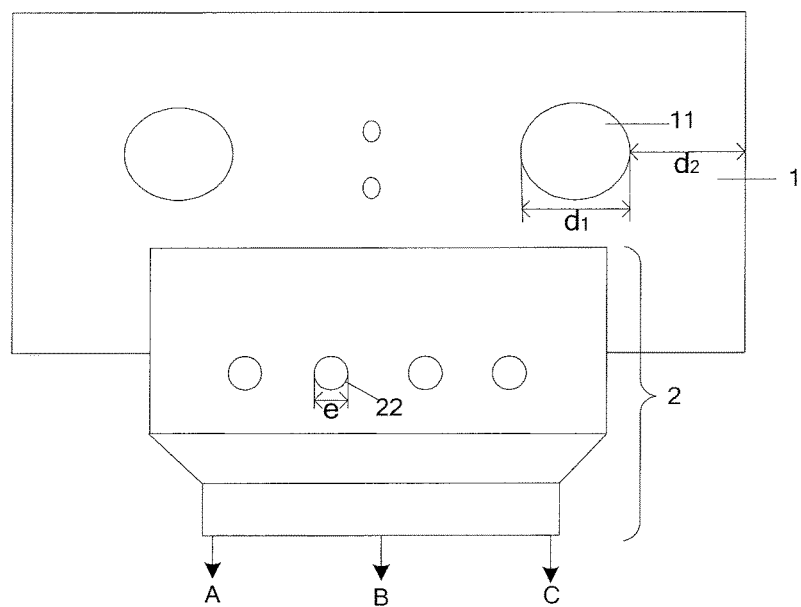
FIG. 4 illustrates a third schematic structural front view of an external-leadwire crimping apparatus according to one embodiment of the present invention.

A specific embodiment is exemplified hereinafter to illustrate in details a sample structure design of the external-leadwire crimping apparatus provided by exemplary embodiments of the invention, the sample structure design being only provided with heat dissipation holes on the crimping tool tip body, as illustrated in FIG. 4, the sample structure being configured as below:

the width of the heating base 1 is configured to be 45 mm; the width of the crimping tool tip 2 is configured to be 34 mm, the thickness thereof is configured to be 2 mm and the chamfers are all configured to be 0.1 mm; the number of the heating holes 11 is configured to be 2; the diameter $d_1$ of the heating holes 11 is configured to be 14 mm; the distance $d_2$ between an edge of a heating hole 11 and a most adjacent side of the heating base 1 is configured to be 1.5 mm; the number of the heating holes 22 is configured to be 4; and the diameter e of the heat dissipation holes is configured to be 2 mm.

Results of actual temperature test on the lower surface of the crimping tool tip in the sample structure design are listed in table 1, as below.

TABLE 1

| Sample set temperature/□ | Temperature at position A/° C. | Temperature at position B/° C. | Temperature at position C/° C. |
| --- | --- | --- | --- |
| 380 | 153.1 | 160 | 151.8 |
| 400 | 158.4 | 166.5 | 156.7 |
| 410 | 163.2 | 171.5 | 162.4 |
| 430 | 168.7 | 175.5 | 166.6 |
| 450 | 174.1 | 181 | 171.9 |

As can be seen readily from the above table 1, the effect of actual temperature test on aforementioned sample structure may be concluded as: there is a maximum temperature difference of 9.8° C. between both left/right sides and central portion of the lower surface of the crimping tool tip, meaning that the temperature difference between both left/right ends and central portion of a lower surface of the crimping tool tip in external-leadwire crimping apparatus provided by exemplary embodiments of the invention is controlled to be constrained within 10° C. such that a uniformity of surface temperatures of the crimping tool tip is ensured.

Similarly, in other embodiments, a variety of modifications and variations can be implemented on the basis of above illustrated basic exemplary embodiments.

According to exemplary embodiments of the invention, by way of example, in aforementioned external-leadwire crimping apparatus, within the crimping tool tip body, at least two rows of heat dissipation holes are arranged in parallel in a direction pointing from one side towards other side of the crimping tool tip body (e.g., in a direction transverse to the thickness direction of the crimping tool tip body), the at least two rows of heat dissipation holes being arranged to be in parallel with at least one of the upper surface and the lower surface of the crimping tool tip body.

As a more specific exemplary embodiment, the at least two rows of heat dissipation holes are arranged in parallel in a direction orthogonal to the thickness direction of the crimping tool tip body As an exemplary embodiment, any one row of the at least two rows of heat dissipation holes is configured to be aligned relative to other row or rows of heat dissipation holes, in a vertical direction perpendicular to at least one of the upper surface and the lower surface of the crimping tool tip body.

Alternatively, in a vertical direction perpendicular to at least one of the upper surface and the lower surface of the crimping tool tip body, any one row of the at least two rows of heat dissipation holes is configured to be not aligned completely relative to other row or rows of heat dissipation holes, e.g., in a staggered and non-aligned arrangement.

An external-leadwire crimping apparatus is provided by embodiments of the present invention, including: a heating base provided with a heating rod and a temperature sensor; a crimping tool tip which is connected with the heating base and supplied with heat from the heating base, the crimping tool tip being configured to crimp a leadwire of a flexible printed circuit board onto a printed circuit board assembly, by curing a conductive adhesive after receipt of heat, and the crimping tool tip comprising a crimping tool tip body. The crimping tool tip body is provided with at least one heat dissipation slot on an upper surface thereof, the heat dissipation slot being configured to penetrate therethrough at both ends; and/or the crimping tool tip body is provided with at least one heat dissipation hole penetrating the thickness direction thereof. Thereby, aforementioned design with heat dissipation slots and/or heat dissipation holes solve a problem of uneven surface temperature of the crimping tool tip caused by a transmission of most of the heat generated by the heating rod towards a central position of the crimping tool tip, such that a uniformity of surface temperature of the crimping tool tip is ensured to control a temperature difference between both left and right ends and a central portion of a lower surface of the crimping tool tip to be constrained within 10° C. so as to offer guarantee for a uniformity of reaction of the conductive adhesive, resulting in an enhanced crimping quality.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present invention exemplarily, and should not be deemed as a restriction thereof.

Although several exemplary embodiments of the general concept of the present invention have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. An external-leadwire crimping apparatus, comprising:
 a heating base provided with a heating rod and a temperature sensor, and
 a crimping tool tip which is connected with the heating base and supplied with heat from the heating base, the crimping tool tip being configured to crimp a leadwire of a flexible printed circuit board onto a printed circuit board assembly by curing a conductive adhesive after receipt of heat, and the crimping tool tip comprising a crimping tool tip body;
 wherein the crimping tool tip body is provided on an upper surface thereof with at least one heat dissipation slot, the heat dissipation slot being configured to extend in a thickness direction, between both ends of the crimping tool tip body and to penetrate the crimping tool tip body at both ends thereof; and
 wherein the crimping tool tip body is provided with at least one heat dissipation hole penetrating the thickness direction thereof.

2. The external-leadwire crimping apparatus according to claim 1,
 wherein the crimping tool tip being provided with at least two heat dissipation holes passing through, the heat dissipation holes being arranged to be in parallel in a direction leading from one side towards another side of the crimping tool tip body.

3. The external-leadwire crimping apparatus according to claim 2,
 wherein diameters of the heat dissipation holes are identical with each other.

4. The external-leadwire crimping apparatus according to claim 2,
 wherein diameters of the heat dissipation holes descend sequentially in both directions leading from a center towards both ends of the crimping tool tip body.

5. The external-leadwire crimping apparatus according to claim 2,
 wherein the heat dissipation holes are arranged in parallel in a direction transverse to the thickness direction of the crimping tool tip body, in a plane parallel to at least one of an upper surface and a lower surface of the crimping tool tip body.

6. The external-leadwire crimping apparatus according to claim 5,
wherein the heat dissipation holes are arranged in parallel in a direction orthogonal to the thickness direction of the crimping tool tip body.

7. The external-leadwire crimping apparatus according to claim 1,
wherein diameters of the heat dissipation holes range from 0.1 mm to 10 mm.

8. The external-leadwire crimping apparatus according to claim 1,
wherein widths of the heat dissipation slots range from 0.1 mm to 10 mm and depths thereof range from 0.1 mm to 10 mm.

9. The external-leadwire crimping apparatus according to claim 1,
wherein the crimping tool tip body comprises a contact portion in contact with a leadwire to be crimped, the contact portion further comprising a stepped integral structure formed by at least two overlapped cuboids; and
wherein cross sections of the cuboids within the stepped integral structure decrease sequentially in a direction from the upper surface towards the lower surface of the crimping tool tip body.

10. The external-leadwire crimping apparatus according to claim 9,
wherein heights of the cuboids within the stepped integral structure range from 0.1 mm to 10 mm; and
wherein a length difference between two adjacent cuboids of the cuboids within the stepped integral structure ranges from 0.2 mm to 200 mm.

11. The external-leadwire crimping apparatus according to claim 1,
wherein a distance between a lower surface of the heating base and the lower surface of the crimping tool tip body ranges from 2 mm to 100 mm.

12. The external-leadwire crimping apparatus according to claim 1,
wherein the heat dissipation slots are provided in an amount of not more than 10.

13. The external-leadwire crimping apparatus according to claim 1,
wherein the heat dissipation holes are provided in an amount of not more than 50.

14. The external-leadwire crimping apparatus according to claim 2,
wherein at least two rows of heat dissipation holes are provided in parallel in a direction transverse to the thickness direction of the crimping tool tip body, the at least two rows of heat dissipation holes being arranged to be in parallel with at least one of the upper surface and the lower surface of the crimping tool tip body.

15. The external-leadwire crimping apparatus according to claim 14,
wherein the at least two rows of heat dissipation holes are arranged in parallel in a direction orthogonal to the thickness direction of the crimping tool tip body.

16. The external-leadwire crimping apparatus according to claim 14,
wherein any one row of the at least two rows of heat dissipation holes are configured to be aligned, relative to other row or rows of heat dissipation holes, in a vertical direction perpendicular to at least one of the upper surface and the lower surface of the crimping tool tip body.

17. The external-leadwire crimping apparatus according to claim 14,
wherein any one row of the at least two rows of heat dissipation holes are configured to be not completely aligned, relative to other row or rows of heat dissipation holes, in a vertical direction perpendicular to at least one of the upper surface and the lower surface of the crimping tool tip body.

18. The external-leadwire crimping apparatus according to claim 17,
wherein any one row of the at least two rows of heat dissipation holes are configured in a staggered and non-aligned arrangement relative to other row or rows of heat dissipation holes, in the vertical direction.

* * * * *